US010622196B2

(12) United States Patent
Nagayama et al.

(10) Patent No.: US 10,622,196 B2
(45) Date of Patent: Apr. 14, 2020

(54) PLASMA PROCESSING APPARATUS

(71) Applicant: Tokyo Electron Limited, Tokyo (JP)

(72) Inventors: Nobuyuki Nagayama, Miyagi (JP); Naoyuki Satoh, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 1184 days.

(21) Appl. No.: 14/461,537

(22) Filed: Aug. 18, 2014

(65) Prior Publication Data
US 2015/0053348 A1 Feb. 26, 2015

(30) Foreign Application Priority Data

Aug. 21, 2013 (JP) .................................. 2013-171081

(51) Int. Cl.
*H01J 37/32* (2006.01)

(52) U.S. Cl.
CPC .... *H01J 37/32642* (2013.01); *H01J 37/3266* (2013.01); *H01J 37/32513* (2013.01); *H01J 37/32522* (2013.01); *H01J 37/32669* (2013.01); *H01J 37/32715* (2013.01)

(58) Field of Classification Search
CPC ........... H01J 37/32642; H01J 37/32513; H01J 37/3266; H01J 37/32522; H01J 37/32669; H01J 37/32715
See application file for complete search history.

(56) References Cited

U.S. PATENT DOCUMENTS

| 5,203,981 A * | 4/1993 | Akazawa .......... H01J 37/32082 118/503 |
| 2004/0152827 A1* | 8/2004 | Iwamoto ................ H01F 1/0533 524/543 |
| 2004/0261946 A1* | 12/2004 | Endoh ................ H01J 37/32082 156/345.15 |
| 2005/0185359 A1 | 8/2005 | Wickramanayaka et al. |
| 2010/0040768 A1* | 2/2010 | Dhindsa ............ H01J 37/32642 427/8 |
| 2012/0281334 A1* | 11/2012 | Sasaki ................. H01L 21/6831 361/234 |

FOREIGN PATENT DOCUMENTS

| JP | H11-330047 | 11/1999 |
| JP | 2005-064460 | 3/2005 |
| JP | 2005-235970 | 9/2005 |
| JP | 2008-171899 | 7/2008 |
| JP | 2010-171344 | 8/2010 |
| JP | 2012-109608 | 6/2012 |
| JP | 2012-134375 | 7/2012 |
| JP | 2012-209359 | 10/2012 |
| JP | 2012-216607 | 11/2012 |

* cited by examiner

Primary Examiner — Jeffrie R Lund
Assistant Examiner — Mirza Israr Javed
(74) Attorney, Agent, or Firm — IPUSA, PLLC

(57) ABSTRACT

A plasma processing apparatus includes a mounting stage on which a substrate is mounted, a focus ring arranged around a periphery of the mounting stage, a plurality of magnetic members arranged at a surface of the focus ring and a surface of the mounting stage facing opposite each other, and a temperature adjustment unit configured to adjust a temperature of the focus ring by introducing a heat transfer gas between the surface of the focus ring and the surface of the mounting stage facing opposite each other.

13 Claims, 9 Drawing Sheets

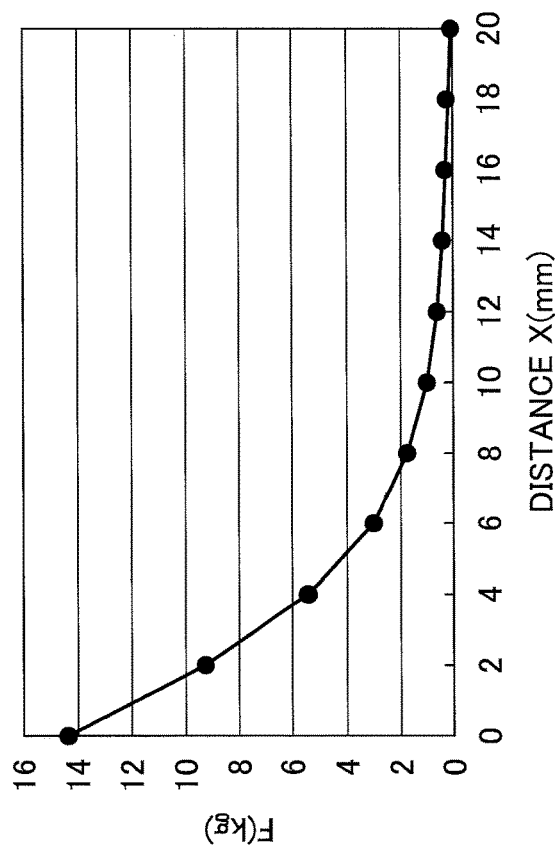
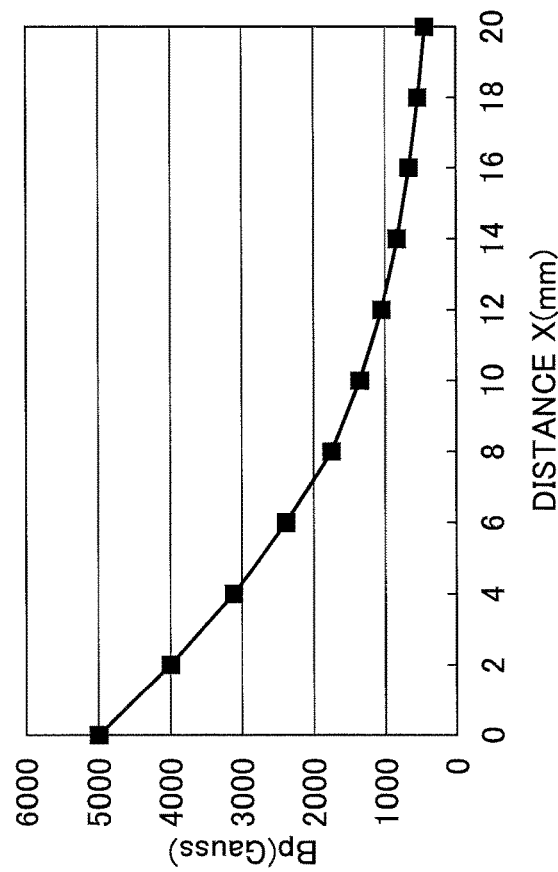
FIG.6A
FIG.6B

FIG.7

| MAGNET SHAPE | φ100mm × 10mm | φ10mm × 1mm | φ10mm × 10mm | φ10mm × 100mm |
|---|---|---|---|---|
| MAGNETIC FLUX DENSITY | 117mT | 113mT | 488mT | 546mT |
| ATTRACTION FORCE | 50kg | 0.5kg | 3.4kg | 4.2kg |
| STANDARD HEAT RESISTANCE 80°C | 60°C | 60°C | 105°C | 150°C |

PLASMA PROCESSING APPARATUS

CROSS-REFERENCE TO RELATED APPLICATIONS

This patent application is based upon and claims the benefit of priority of Japanese Patent Application No. 2013-171081 filed on Aug. 21, 2013, the entire contents of which are incorporated herein by reference.

BACKGROUND OF THE INVENTION

1. Field of the Invention

The present invention generally relates to a plasma processing apparatus.

2. Description of the Related Art

In a semiconductor manufacturing process, plasma processes such as etching and film deposition are performed on a workpiece such as a semiconductor wafer (simply referred to as "wafer" hereinafter).

Plasma processing apparatuses that subject a wafer to a plasma process include a mounting stage on which the wafer is mounted and a focus ring arranged on the mounting stage to surround the periphery of the wafer. The focus ring is configured to extend a plasma distribution region generated above the wafer to a region above the focus ring in order to secure plasma processing uniformity of a plasma process that is performed on the entire face of the wafer.

During a plasma process, the wafer and the focus ring are directly exposed to plasma and is heated to a relatively high temperature. Thus, the temperature of the mounting stage is desirably controlled so that the temperature of the wafer and the temperature of the focus ring may be controlled and the focus ring may be cooled. When the heat transfer efficiency between the mounting stage and the focus ring is low, heat input from plasma may not be efficiently transferred from the focus ring to the mounting stage and temperature adjustment of the focus ring may be difficult. In this respect, a technique is known that involves fixing a heat transfer sheet such as silicon rubber to the focus ring to improve the heat transfer efficiency between the mounting stage and the focus ring (see e.g. Japanese Laid-Open Patent Publication No. 2008-171899).

However, the heat transfer sheet is an adhesive sheet and its heat transfer performance may vary depending on the manner in which the heat transfer sheet is adhered to the focus ring as well as the individual variability of the heat transfer sheet. That is, when the adhesive power of the heat transfer sheet is weak, the adhesion between the focus ring and the mounting stage may be degraded, and heat may not be efficiently transferred from the focus ring to the mounting stage. Also, outgassing from the heat transfer sheet may occur. Further, the heat transfer sheet may not be easily peeled off of the focus ring. Accordingly, the temperature of the focus ring is fixed by the specification of the heat transfer sheet and the temperature of the focus ring cannot be variably controlled.

In light of the above, there is a demand for a technique for improving the heat transfer efficiency between the mounting stage and the focus ring and enabling variable control of the temperature of the focus ring.

SUMMARY OF THE INVENTION

According to an embodiment of the present invention, a plasma processing apparatus is provided that includes a mounting stage on which a substrate is mounted, a focus ring arranged around a periphery of the mounting stage, a plurality of magnetic members arranged at a surface of the focus ring and a surface of the mounting stage facing opposite each other, and a temperature adjustment unit configured to adjust a temperature of the focus ring by introducing a heat transfer gas between the surface of the focus ring and the surface of the mounting stage facing opposite each other.

According to an aspect of the present invention, heat transfer efficiency between the mounting stage and the focus ring may be improved and the temperature of the focus ring may be variably controlled.

BRIEF DESCRIPTION OF THE DRAWINGS

FIGS. 6A-6B are graphs illustrating relationships between a distance of a magnet from an iron plate, a magnetic flux density, and an attraction force of the magnet according to an embodiment of the present invention;

FIG. 7 is a table illustrating a relationship between the magnetic flux density and the attraction force of a magnet according to an embodiment of the present invention;

DETAILED DESCRIPTION OF THE PREFERRED EMBODIMENTS

In the following, embodiments of the present invention are described with reference to the accompanying drawings. Note that elements described below having substantially identical features are given the same reference symbols and overlapping descriptions thereof may be omitted.

[Plasma Processing Apparatus/Substrate Supporting Apparatus]

Figure 1:
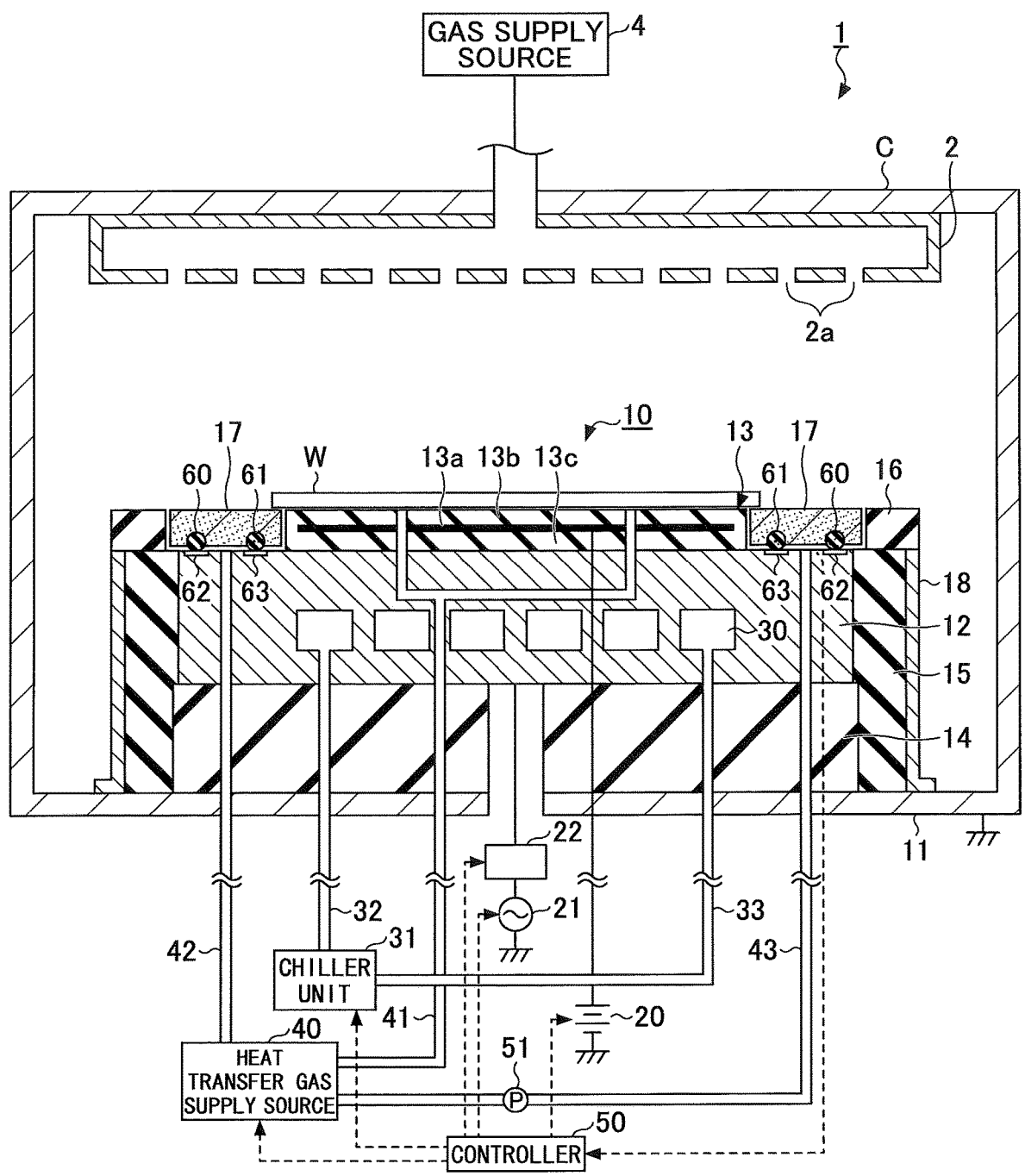
FIG. 1 is a longitudinal cross-sectional view of a plasma processing apparatus according to an embodiment of the present invention.

In the following, a plasma processing apparatus and a substrate supporting apparatus according to an embodiment of the present invention are described with reference to FIG. 1. FIG. 1 is a longitudinal cross-sectional view of a plasma processing apparatus according to an embodiment of the present invention. The plasma processing apparatus 1 illustrated in FIG. 1 includes a chamber (processing chamber) C that may be cylindrically-shaped, for example. The chamber C is grounded. A substrate supporting apparatus 10 is arranged on a lower wall of the chamber C. An upper electrode 2 is arranged at a ceiling portion of the chamber C to face opposite the substrate supporting apparatus 10. A gas supply source 4 is connected to the upper electrode 2. Gas supplied from the gas supply source 4 passes through a plurality of gas holes 2a arranged at the upper electrode 2 to be introduced into the chamber C. The upper electrode 2 acts as a shower head for supplying gas into the chamber C as well as an electrode. In the chamber C, a plasma process is performed on a wafer using a plasma generated from the gas supplied thereto.

The substrate supporting apparatus 10 acts as an electrode facing opposite the upper electrode 2 and a holding mechanism for holding a substrate such as a semiconductor wafer (referred to as "wafer W" hereinafter).

The substrate supporting apparatus 10 includes a mounting stage 12, an electrostatic chuck 13, insulating members 14-16, and a focus ring 17. The substrate supporting apparatus 10 also has a ring-shaped side wall 18 fixed to the lower wall 11. The insulating member 14 is fixed to the lower wall 11. The mounting stage 12 is arranged on a top surface of the insulating member 14. The mounting stage 12 may be made of aluminum, for example. The insulating member 15 is ring-shaped and is arranged around the mounting stage 12 and the insulating member 14. The insulating member 15 is arranged to be in contact with an inner face of the side wall 18.

The electrostatic chuck 13 is fixed on the mounting stage 12. The electrostatic chuck 13 includes an electrode 13*a* made of a conductive film that is interposed between a pair of insulating sheets 13*b* and 13*c*. A DC power supply source 20 is connected to the electrode 13*a*. When a voltage is supplied from the DC power supply source 20, the wafer W is electrostatically attracted to the electrostatic chuck 13 by a Coulomb force.

The focus ring 17 for improving in-plane etching uniformity is arranged around the periphery of the electrostatic chuck 13. The focus ring 17 may be made of a dielectric material such as quartz, for example. A wafer W (example of a substrate) to be processed is placed on the electrostatic chuck 13. The focus ring 17 is arranged within an inner space created by the insulating member 16, which is arranged into a planar ring-shaped member.

A high frequency current is supplied to the mounting stage 12 from a high frequency power source 21 via a matching circuit 22. The mounting stage 12 is electrically insulated from the chamber C, including the lower wall 11, by the insulating members 14 and 15.

A path 30 for enabling the flow of a liquid for temperature control is formed within the mounting stage 12. The path 30 is connected to a chiller unit 31 via pipes 32 and 33. A coolant at a predetermined temperature that is output from the chiller unit 31 is supplied to and circulated within the pipes 32 and 33 and the path 30. In this way, the temperature of the mounting stage 12 may be controlled and maintained at a desired temperature or within a desired temperature range, for example.

A heat transfer gas supply source 40 supplies a heat transfer gas such as helium (He) gas between an upper surface (front side surface) of the electrostatic chuck 13 and a bottom surface (backside surface) of the wafer W via a gas supply line 41. In this way, heat transfer efficiency between the electrostatic chuck 13 and the wafer W may be improved by the heat transfer gas.

Also, the heat transfer gas supply source 40 supplies the heat transfer gas such as He gas between the upper surface (front side surface) of the mounting stage 12 and a bottom surface (backside surface) of the focus ring 17 via gas supply lines 42 and 43. In this way, heat transfer efficiency between the mounting stage 12 and the focus ring 17 may be improved by the heat transfer gas.

The controller 50 controls the DC power supply source 20, the high frequency power source 21, the matching circuit 22, the chiller unit 31, and the heat transfer gas supply source 40. Also, a pressure gauge 51 is attached to the gas supply line 43 and is configured to measure the pressure of the heat transfer gas supplied between the mounting stage 12 and the focus ring 17. The pressure gauge 51 is connected to the controller 50 and is configured to communicate the measured pressure value to the controller 50.

The controller 50 controls the flow rate of the heat transfer gas output from the heat transfer gas supply source 40 based on the pressure value to control the pressure of the heat transfer gas supplied between the mounting stage 12 and the focus ring 17. For example, the pressure of the heat transfer gas may be raised by increasing the flow rate of the heat transfer gas. In this way, heat transfer efficiency between the mounting stage 12 and the focus ring 17 may be improved and cooling of the focus ring 17 may be accelerated. On the other hand, when the flow rate of the heat transfer gas is decreased, the pressure of the heat transfer gas is reduced. As a result, the heat transfer efficiency is degraded and cooling of the focus ring 17 is suppressed. The controller 50 is an example of a temperature adjustment unit configured to adjust the temperature of the focus ring 17 by introducing a heat transfer gas between surfaces of the mounting stage 12 and the focus ring 17 facing opposite each other.

The controller 50 includes a CPU (Central Processing Unit), a ROM (Read Only Memory), and a RAM (Random Access Memory), which are not shown. The CPU executes programs for performing a plasma process or adjusting the temperature of the focus ring 17 according to various recipes stored in a storage unit such as the RAM or ROM. In some embodiments, the recipes may be stored in a storage medium and loaded in the storage unit via a driver (not shown), or the recipes may be downloaded from a network (not shown) and stored in the storage unit, for example. Further, the functions of the elements described above may be implemented by a DSP (Digital Signal Processor) instead of the CPU, for example. Note that the functions of the controller 50 may be implemented by hardware, software, or a combination thereof, for example.

(Magnetic Members)

Figure 2:
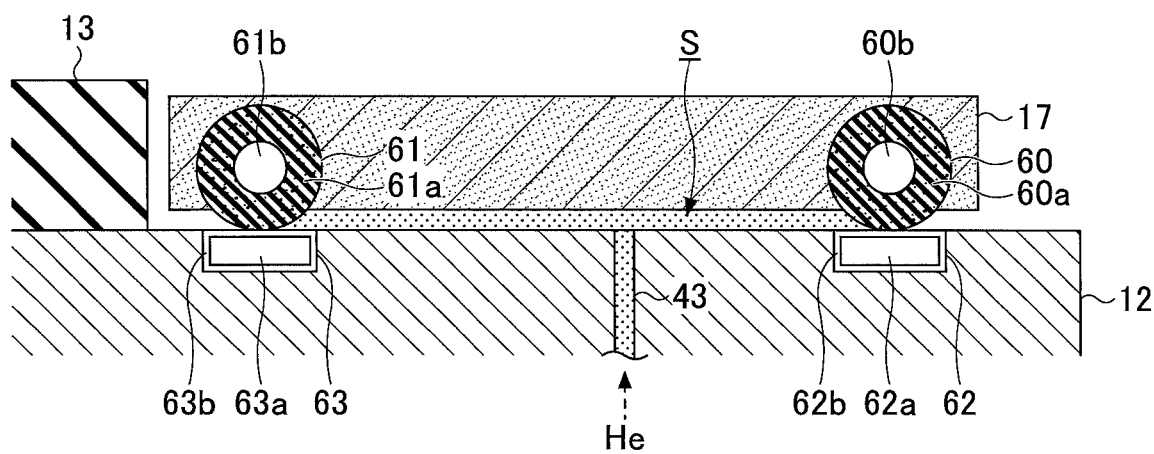
FIG. 2 illustrates an exemplary configuration of the plasma processing apparatus near a focus ring according to an embodiment of the present invention.

In the following, magnetic members arranged at the surfaces of the focus ring 17 and the mounting stage 12 facing opposite each other are described. As illustrated in FIGS. 1 and 2, magnetic O-ring members 60 and 61 are respectively arranged along an outer circumference and an inner circumference of the bottom surface of the focus ring 17. Also, on the upper surface of the mounting stage 12 facing opposite the focus ring 17, magnetic bodies 62 and 63 are arranged at positions facing opposite the magnetic O-ring members 60 and 61, respectively.

The magnetic O-ring members 60 and 61 include O-rings 60*a* and 61*a* that are made of rubber and magnets 60*b* and 61*b* that are embedded within the O-rings 60*a* and 61*a*, respectively. With such configurations, the magnetic O-ring members 60 and 61 may function as magnets and sealing members.

As an exemplary method for fixing the magnetic O-ring members 60 and 61 to the focus ring 17, grooves may be formed along the outer circumference and the inner circumference of the bottom surface of the focus ring 17, and the magnetic O-ring members 60 and 61 may be fitted into the grooves utilizing the contractility of the O-rings 60*a* and 61*a*, which are made of rubber. Note that the shape of the grooves formed at the bottom surface of the focus ring 17 may have specific features. For example, the grooves may be arranged into dovetail (trapezoidal) grooves, the grooves may have specific designs at entry points, or the grooves may have specific groove depths.

The magnetic bodies 62 and 63 may be magnetic plate members including plates 62a and 63a spray coated with magnetic materials 62b and 63b, or magnetic sheets coated with magnetic material, for example. To avoid metal contamination within the processing chamber C, the magnetic materials 62 and 63 are preferably not exposed at the mounting stage 12 and are embedded within the mounting stage 12. Note that sealing properties of the magnetic bodies 62 and 63 may be inferior to those of the magnetic O-ring members 60 and 61, but the magnetic bodies 62 and 63 may have a superior attraction force (clamping force), for example.

The magnetic body 62 and the magnetic O-ring member 60 are provided as a pair at positions facing opposite each other on the surfaces of the focus ring 17 and the mounting stage 12 facing opposite each other. The magnetic body 62 and the magnetic O-ring member 60 have opposite magnetic poles (N pole or S pole). Similarly, the magnetic body 63 and the magnetic O-ring member 61 are provided as a pair at positions facing opposite each other on the surfaces of the focus ring 17 and the mounting stage 12 facing opposite each other, and the magnetic body 63 and the magnetic O-ring member 61 have opposite magnetic poles (N pole or S pole). In this way, a clamping force may be generated by the magnetic force between the bottom surface of the focus ring 17 and the upper surface of the mounting stage 12.

Also, the magnetic O-ring members 60 and 61 seal a space S between the bottom surface of the focus ring 17 and the upper surface of the mounting stage 12. Heat transfer gas such as He gas is filled into the space S. In this way, heat transfer efficiency between the focus ring 17 and the mounting stage 12 may be improved such that heat input from plasma to the focus ring 17 during a plasma process may be efficiently transmitted to the mounting stage 12. Thus, the focus ring 17 may be efficiently cooled.

Note that the magnetic O-ring members 60 and 61, and the magnetic bodies 62 and 63 are merely illustrative examples of magnetic members, and the magnetic members are not limited to these examples. Other examples of magnetic members include magnets 64 and 65 as illustrated in FIG. 3A, for example.

The combination of magnetic members disposed on the mounting stage 12 and the focus ring 17 may be any combination of the magnetic O-ring members, the magnetic bodies, and/or the magnets, for example. Further, a combination of magnetic members of the same type may be disposed at opposite positions of the focus ring 17 and the mounting stage 12, or a combination of different types of magnetic members may be disposed at opposite positions of the focus ring 17 and the mounting stage 12.

Figure 3A:
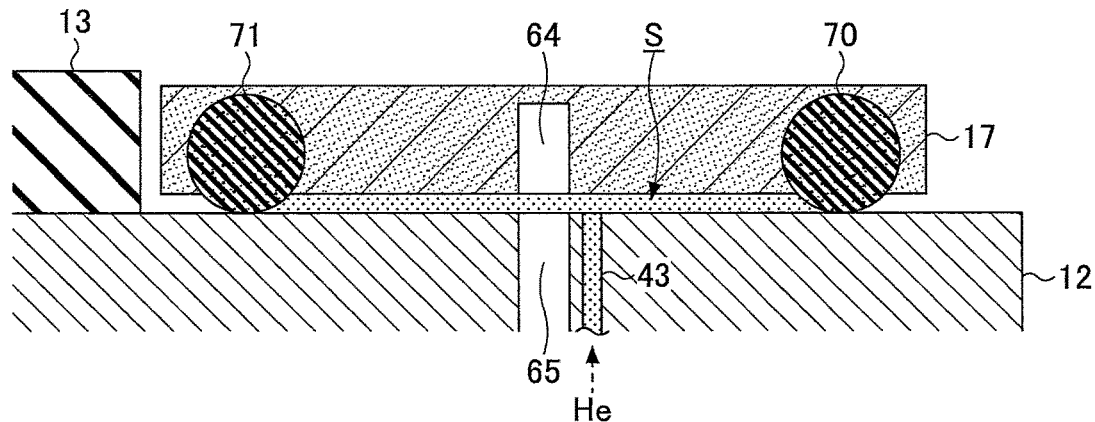
FIGS. 3A-3C illustrate another exemplary configuration of the plasma processing apparatus near the focus ring according to an embodiment of the present invention.

For example, as illustrated in FIG. 3A, O-ring members 70 and 71 may be fit into the bottom surface of the focus ring 17 along the outer circumference and inner circumference of the focus ring 17, and the magnets 64 and 65 may be disposed at center positions of the surfaces of the focus ring 17 and the mounting stage 12 facing opposite each other to generate a clamping force. Also, heat transfer gas such as He gas is preferably filled into the space S, which is sealed by the O-ring members 70 and 71. In this way, heat input to the focus ring 17 may be efficiently transferred to the mounting stage 12.

Figure 3B:
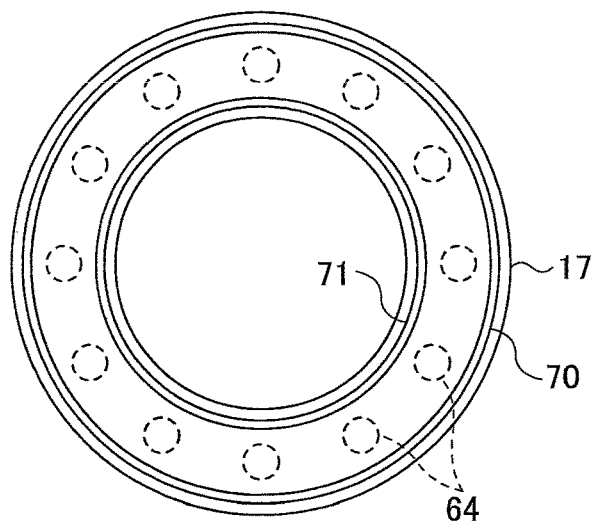
Figure 3C:
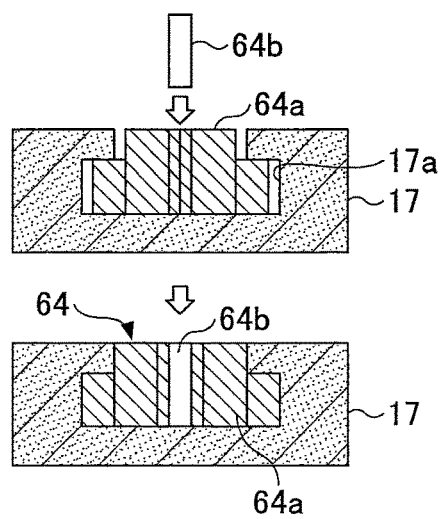

FIG. 3B illustrates the bottom surface of the focus ring 17. As illustrated in FIG. 3B, the O-ring members 70 and 71 may be arranged into rings encircling the bottom surface of the focus ring 17. Similarly, the magnets 64 may be arranged in a ring. In FIG. 3B, the magnets 64 are disposed at equal intervals in the circumferential direction of the focus ring 17. FIG. 3C illustrates an exemplary method of fixing magnet parts 64b of the magnets 64 in the focus ring 17 in order to realize the arrangement of the magnets 64 as illustrated in FIG. 3B.

As illustrated in FIG. 3C, a locknut 64a is divided into two parts; namely, an inner part and an outer part. A helical groove is formed at an opening arranged at the center of the inner part of the locknut 64a as a screw structure. A helical groove is also formed at the periphery of the magnet 64 as a screw structure. The locknut 64a may be made of resin, a ceramic, or a non-magnetic metal, for example.

To fix the magnet 64 to the focus ring 17, first, the outer part of the locknut 64a is arranged at a shoulder portion of a groove 17a formed at the focus ring 17. Then, the inner part of the locknut 64a is inserted into the center of the groove 17a. Then, the opening arranged at the center of the locknut 64a is opened, the magnet part 64b is inserted into the opening, and the magnet part 64b is screwed into the locknut 64a.

In the following, other exemplary combinations of the magnetic members arranged at the focus ring 17 and the mounting stage 12 are described with reference to FIGS. 4A-4C.

Figure 4A:
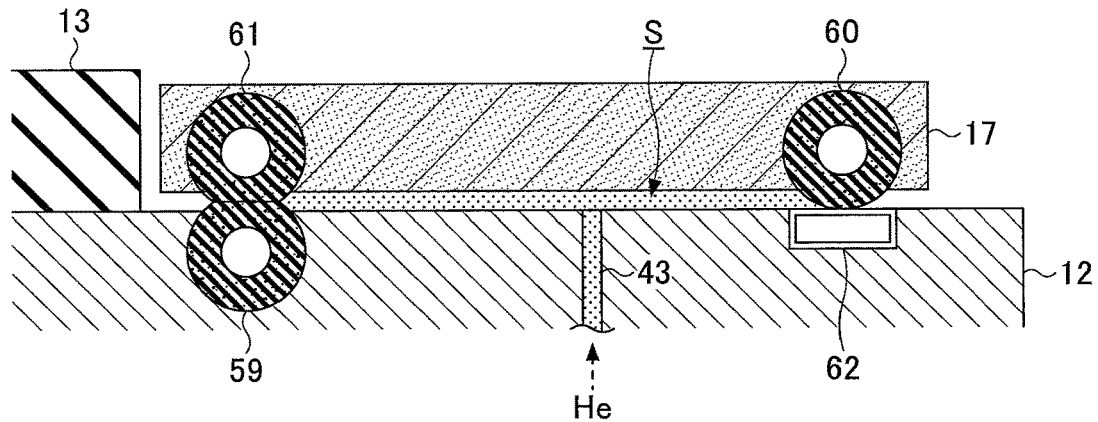
FIGS. 4A-4C illustrate other exemplary configurations of the plasma processing apparatus near the focus ring according to an embodiment of the present invention.

In FIG. 4A, the magnetic O-ring members 60 and 61 are arranged along the outer circumference and the inner circumference of the bottom surface of the focus ring 17. The magnetic body 62 is arranged along an outer circumference of the upper surface of the mounting stage 12 at a position facing opposite the magnetic O-ring 61, and a magnetic O-ring member 59 is arranged along an inner circumference of the upper surface of the mounting stage 12 at a position facing opposite the magnetic O-ring member 61. In this way, a clamping function may be achieved by the above magnetic members and a sealing function may be achieved by the magnetic O-rings 59-61. Also, the temperature of the focus ring 17 may be adjusted by the He gas supplied from the gas supply line 43.

Figure 4B:
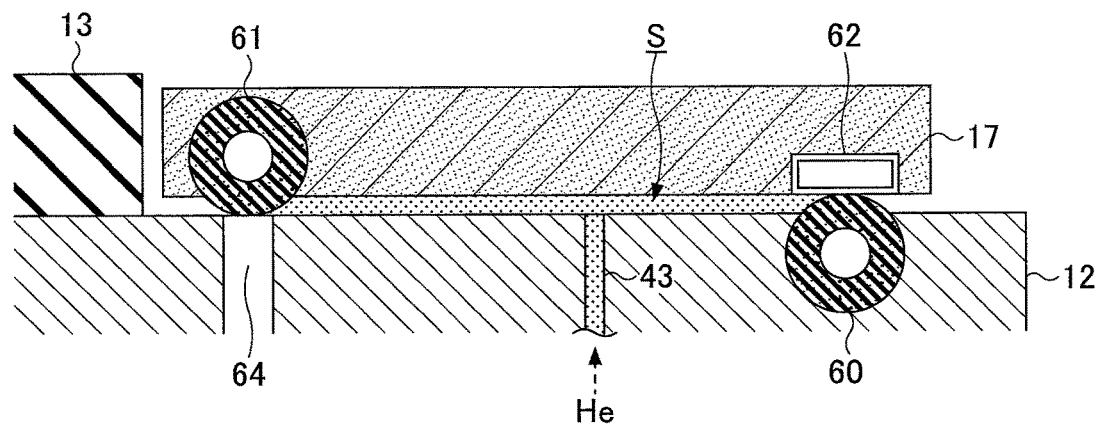

In FIG. 4B, the magnetic body 62 and the magnetic O-ring member 61 are arranged along the outer circumference and the inner circumference of the bottom surface of the focus ring 17. The magnetic O-ring member 60 is arranged along the outer circumference of the upper surface of the mounting stage 12 at a position facing opposite the magnetic body 62, and the magnets 63 are arranged along the inner circumference of the upper surface of the mounting stage 12 at positions facing opposite the magnetic O-ring member 61. In this way, the clamping function may be achieved by the above magnetic members and the sealing function may be achieved by the magnetic O-ring members 60 and 61. Also, the temperature of the focus ring 17 may be adjusted by the He gas supplied from the gas supply line 43.

Figure 4C:
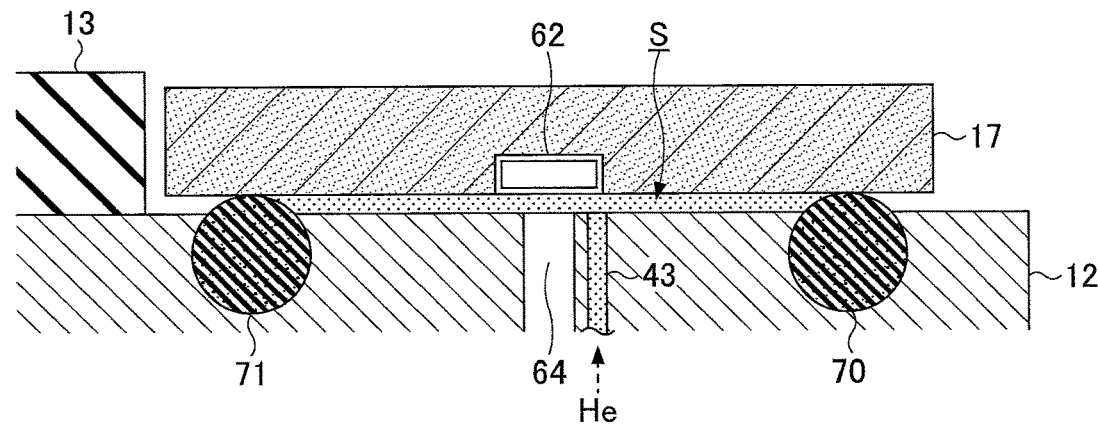

In FIG. 4C, the magnetic body 62 is arranged at a center position of the bottom surface of the focus ring 17. The magnet 64 is arranged to face opposite the magnetic body 62 at a center position of the upper surface of the mounting stage 12. The O-ring members 70 and 71 are arranged along the outer circumference and the inner circumference of the upper surface of the mounting stage 12. In this way, the clamping function may be achieved by the magnetic members arranged at the center positions of the focus ring 17 and the mounting stage 12, whereas the sealing function may be achieved by the O-ring members 70 and 71 arranged along the outer circumference and the inner circumference of the mounting stage 12. Also, the temperature of the focus ring 17 may be adjusted by the He gas supplied from the gas supply line 43.

Note that the arrangements of the magnetic members illustrated in FIGS. 2-4C are merely illustrative examples. The arrangement of the magnetic members is not particularly limited and may take other various arrangements. Also, the combination of magnetic members disposed at positions of the focus ring 17 and the mounting stage 12 facing opposite each other may be any combination of the various types of magnetic members. For example, one or more ring-shaped magnetic members may be arranged along the circumferential directions of the focus ring 17 and the mounting stage 12, one or more rod-shaped magnetic members may be arranged along the radial directions of the focus ring 17 and the mounting stage 12. Also, the magnetic members may be arranged at equidistant intervals, or the magnetic members may be arranged at varying intervals. Note, however, that at least two magnetic members are preferably arranged at the inner circumference side and the outer circumference side of the focus ring 17 and the mounting stage 12. Also, note that the heat transfer efficiency may be improved by increasing the volume of He gas enclosed in the space S between the focus ring 17 and the mounting stage 12. Also, a plurality of magnetic members are preferably arranged in order to achieve uniformity in the clamping force. In this way, uniformity may be achieved in the temperature distribution within the space S, and heat transfer efficiency may be further improved, for example.

[Gap]

Figure 5:
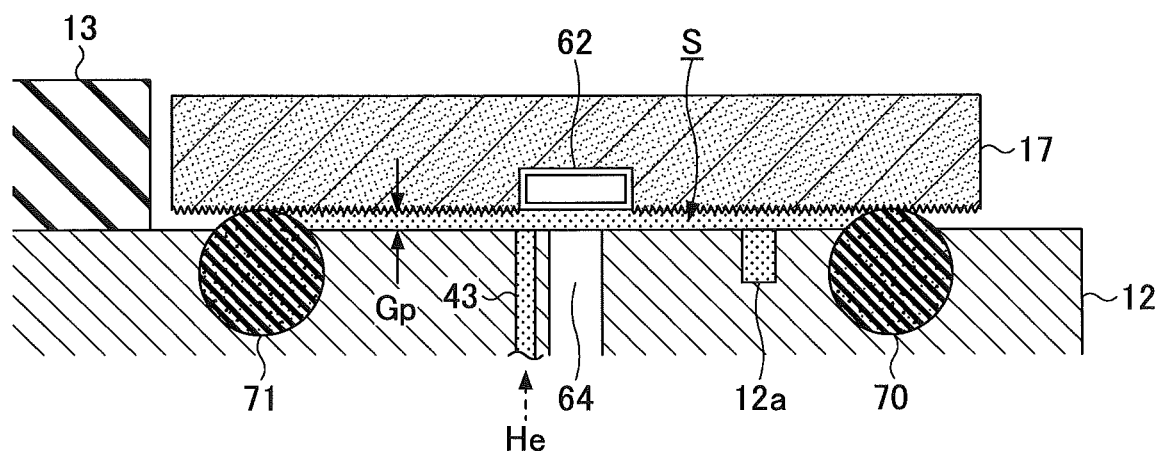
FIG. 5 illustrates temperature adjustment of the focus ring according to an embodiment of the present invention.

Note that when a gap Gp between the focus ring 17 and the mounting stage 12 (see FIG. 5) is too wide, an adequately high heat transfer efficiency cannot be obtained even if He gas is introduced into the space S between the focus ring 17 and the mounting stage 12. To obtain an adequately high heat transfer efficiency, the gap Gp is preferably arranged to be around 10 µm. Meanwhile, the width of the space S (distance between the O-rings 70 and 71 in FIG. 5) is roughly around 20-30 mm. When the space S has a small height and a relatively large width, He gas is prevented from being effectively diffused within the space S. Accordingly, in some embodiments, a groove 12a for diffusing the heat transfer gas may be formed in at least one of the surfaces of the focus ring 17 and the mounting stage 12 facing opposite each other. In this way, heat transfer efficiency may be improved. Note that in FIG. 5, the groove 12a is formed in the mounting stage 12. However, this is merely one illustrative example. That is, the groove 12a may be formed in one or both of the surfaces of the focus ring 17 and the mounting stage 12 defining the boundaries of the space S. In a case where the groove 12a is ring-shaped, the groove 12a may be arranged into at least one circle, and in some embodiments, the groove 12a may be arranged into two or three concentric circles, for example. Further, the shape of the groove 12a is not limited to a ring-shape, and in other embodiments, the groove 12a may be arranged into a spiral shape or the groove 12a may be arranged radially, for example.

Further, in order to improve heat transfer efficiency, the backside surface of the focus ring 17 may be arranged into a concavo-convex surface to increase the surface area of the backside surface of the focus ring 17. Blasting is one exemplary processing method that may be used to arrange the backside surface of the focus ring 17 into a concavo-convex surface. Thermal spraying is another processing method that may be used. In this case, silicon is preferably sprayed on the backside surface of the focus ring 17 to form a concavo-convex surface. In this way, the surface area (heat transfer area) of the backside surface of the focus ring 17 may be enlarged while maintaining the gap Gp to be within a range of several µm to 10 µm so that the heat transfer efficiency may be improved. Note that in some embodiments, the concavo-convex surface may be formed on the mounting stage 12.

Further, in order to increase the surface area, a special sheet may be arranged on a surface defining the space S. For example, an adhesive tape having carbon nanotubes with diameters of several to several tens of nanometers arranged at a density of approximately 100 billion per 1 $cm^2$ may be arranged on at least one of the backside surface of the focus ring 17 and the upper surface of the mounting stage 12 defining the boundaries of the space S. In this way, the surface area the surface defining the space S may be substantially increased by the carbon nanotubes growing from the adhesive tape arranged on the backside surface of the focus ring 17 and/or the upper surface of the mounting stage 12. As a result, heat transfer efficiency may be further improved.

(Attraction Force of Magnet Spaced from Iron Plate)

With respect to a magnet that is adhered to an iron plate, the attraction force of the magnet toward the iron plate is proportional to the squared value of a surface magnetic flux density at the contact surface and the area of contact between the magnet and the iron plate. Similarly, with respect to a magnet that is spaced apart from an iron plate, the attraction force of the magnet toward the iron plate may be assumed to be proportional to the squared value of a space magnetic flux density and the area of the magnet relative to the iron plate. Note that "space magnetic flux density" refers to the magnetic flux density at the position of the iron plate spaced apart from the magnet. However, in the present case, the situation is somewhat complicated because the following relation also applies. That is, when the magnet is spaced apart from the iron plate, the attraction force of the magnet to the iron plate is inversely proportional to the squared value of the distance between the magnet and the iron plate.

Note, however, that the inverse-square law is based on Coulomb's law for magnetic poles, and actual magnets do not accurately follow the inverse-square law and vary greatly depending on their shapes, for example.

FIGS. 6A-6B are graphs illustrating relationships between the attraction force F, the magnetic flux density Bp, and the distance X of a φ20×10 mm neodymium magnet (Neo48) with respect to an iron plate. According to the graph of FIG. 6A, the magnetic flux density Bp decreases as the distance X of the magnet from the iron plate increases. Also, the magnetic flux density may vary depending on the residual magnetic flux density and the shape of the magnet. For example, as can be appreciated from FIG. 7, the magnetic flux density and the attraction force of a magnet do not have a proportional relationship. That is, the magnetic flux density increases as the height of the magnet in its magnetization direction increases.

Similarly, the attraction force F of the magnet may vary depending on the residual magnetic flux density and the shape of the magnet. According to FIG. 6B, the attraction force F of the magnet becomes weaker as the distance X of the magnet from the iron plate increases. Note that the magnetic flux density Bp and the attraction force F when the distance X is equal to 0 (zero) corresponds to the surface magnetic flux density and the attraction force of the magnet, respectively, when the magnet is adhered to the iron plate.

(Influence of Substance between Iron Plate and Magnet)

Even if a substance that is not attracted to a magnet is inserted between magnets having opposite magnetic poles, magnetic field lines may pass through the substance as in the case of passing through air. Thus, the magnetic flux density $B_p$ may be assumed to be substantially similar to the attraction force of the magnet spaced apart from the iron plate. For example, the above may apply to situations where a substance such as plastic, glass, rubber, paper, wood or the like is inserted between the magnets. Further, the above may apply to situations where a non-magnetic metal that is not attracted to a magnet such as aluminum or stainless steel is inserted between the magnets. On the other hand, when a substance that is attracted to a magnet is inserted between the magnet and the iron plate, the magnetic field lines are blocked (absorbed). Thus, the attraction force of the magnet toward the iron plate may be diminished or completely lost. Note, however, that even if a magnetic material is placed between the magnet and the iron plate, if the magnetic material is very thin, most of the field lines may pass through the magnetic material. Although neodymium magnets are covered by nickel (plating), which is a magnetic material, because they are thin films with film thicknesses of about 10 micrometers, they do not significantly affect the performance of the magnet.

(Attraction Force Between Magnets)

In a case where a set of magnetized magnets having the same shape are arranged opposite each other at the N pole and the S pole, when compared with the case where the magnet is facing opposite an iron plate, the space (surface) magnetic flux density between the magnets may be substantially equivalent to the magnetic flux density when the distance between the magnet and the iron plate is reduced to about ½. Thus, a very strong attraction force may be generated in this case.

[Other Configurations]

In the following, other exemplary configurations of the substrate supporting apparatus 10 near the focus ring 17 are described with reference to FIGS. 8A-8C. Note that in the examples illustrated in FIGS. 8A-8C, instead of filling the gap Gp (see FIG. 5) with He gas to control the temperature of the focus ring 17, a heat transfer sheet 80 is arranged within the gap Gp between the focus ring 17 and the mounting stage 12. The heat transfer sheet 80 may be attached to the focus ring 17 or the mounting stage 12, or embedded between the focus ring 17 and the mounting stage 12, for example.

Figure 8A:
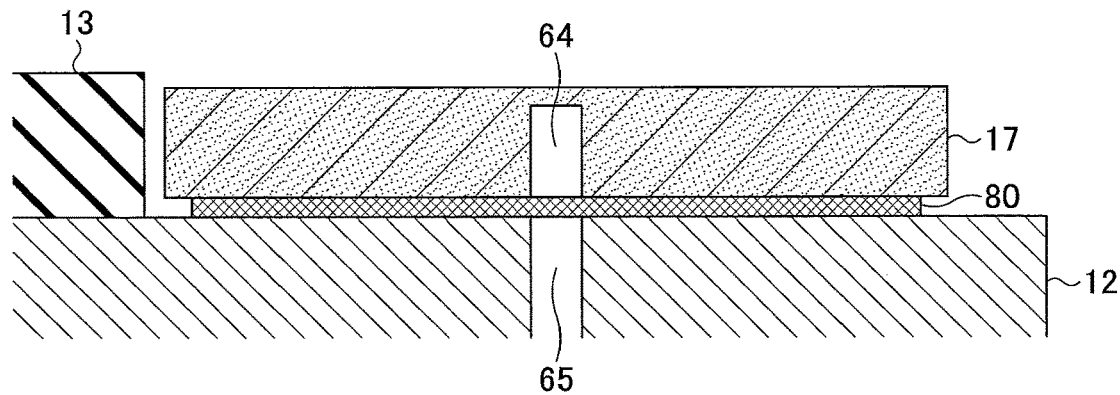
FIGS. 8A-8C illustrate other exemplary configurations of the plasma processing apparatus near the focus ring.

In the example illustrated in FIG. 8A, the magnetic body 64 is arranged at the center position of the bottom surface of the focus ring 17. The magnet 65 is arranged on the upper surface of the mounting stage 12 at a position opposite the magnetic body 64. The heat transfer sheet 80 is arranged within the gap Gp.

Figure 8B:
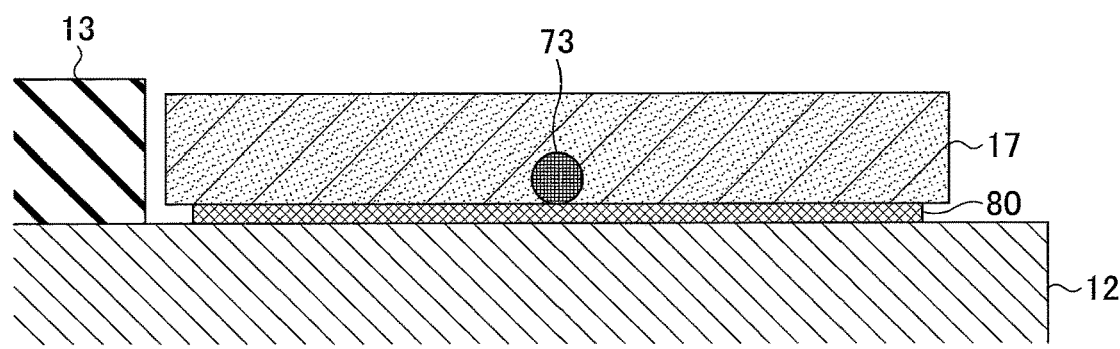

In the example illustrated in FIG. 8B, a weight 73 is arranged at the bottom surface of the focus ring 17. The focus ring 17 is made of silicon and is therefore relatively lightweight. Accordingly, in the present example, a substance that is relatively heavy is embedded in the focus ring 17. In this way, adhesion between the focus ring 17 and the mounting stage 12 may be reinforced by gravity. The weight 73 may be made of tungsten or gold, for example. Note, however, that in order to avoid metal contamination in the processing chamber C, the weight 73 is preferably embedded in the focus ring 17 so as not to be exposed to the plasma space. Also, the heat transfer sheet 80 is arranged within the gap Gp.

Further, although not illustrated in FIGS. 8A and 8B, in some embodiments, in addition to arranging the heat transfer sheet 80 on at least one of the surfaces of the focus ring 17 and the mounting stage 12 facing opposite each other, a sheet member may be arranged as a preventive measure against contamination of the processing chamber C by the heat transfer sheet 80. In the example illustrated in FIG. 8C, a sheet member (plate member) 81 coated with an O-ring material is arranged along the inner circumference and the outer circumference of the focus ring 17. The O-ring material may be a radical resistant material such as perfluoroelastomer (FFKM) or silicon, for example. Also, in the example illustrated in FIG. 8C, the magnet 64 is arranged at the center position of the bottom surface of the focus ring 17 and the magnetic body 62 is arranged at the upper surface of the mounting stage 12 at a position facing opposite the magnet 64.

Figure 8C:
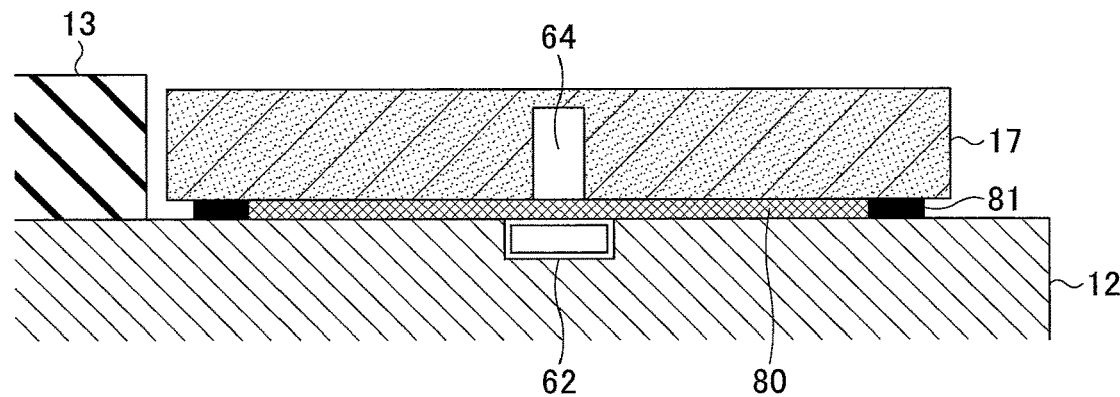

Note that although a gas supply line for supplying a heat transfer gas is not shown in FIGS. 8A-8C, in some embodiments, a heat transfer gas may be introduced between the surfaces of the focus ring 17 and the mounting stage 12 facing opposite each other in addition to arranging the heat transfer sheet 80 on at least one of the surfaces of the focus ring 17 and the mounting stage 12 facing opposite each other. Also, magnetic members are arranged on the surfaces of the focus ring 17 and the mounting stage 12 facing opposite each other.

[Displacement Prevention Mechanism]

Figure 9A:
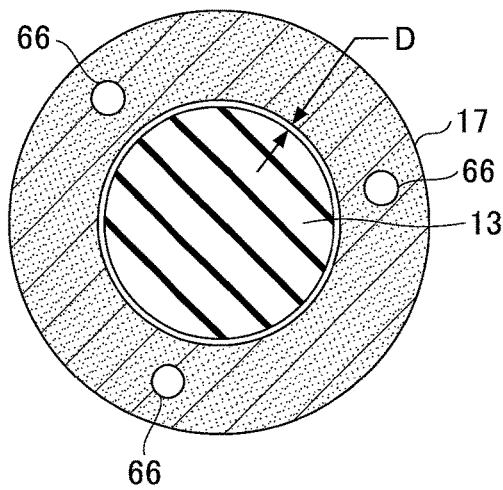
FIGS. 9A-9C illustrate a displacement prevention mechanism according to an embodiment of the present invention.

As illustrated in FIG. 9A, an interspace D is provided between the periphery of the electrostatic chuck 13 and the inner periphery of the focus ring 17. The interspace D needs to be provided in order to prevent cracking or damage to the focus ring 17. That is, because the electrostatic chuck 13 and the focus ring 17 have differing thermal expansion coefficients, the electrostatic chuck 13 may thermally expand to a greater extent than the focus ring 17 during a plasma process, for example. As a result, the periphery of the electrostatic chuck 13 may come into contact with and press the inner periphery of the focus ring 17 to thereby cause damage to the focus ring 17. To avoid such damage to the focus ring 17, the interspace D is preferably provided at a uniform width in the radial direction.

Figure 9B:
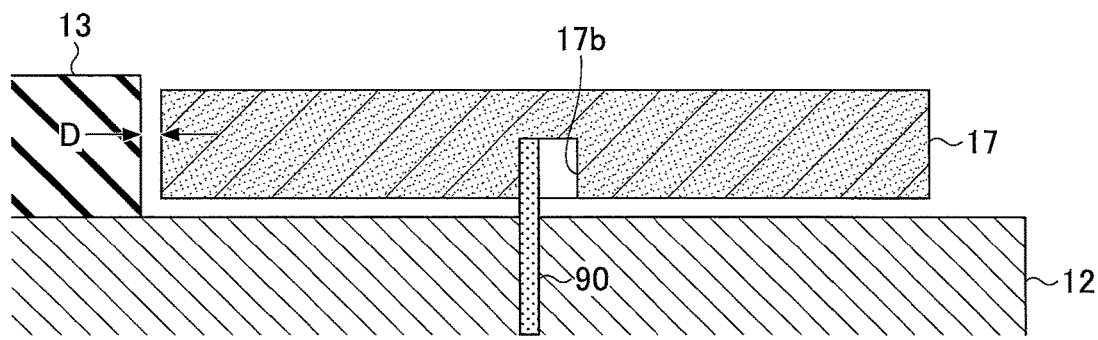

In order to arrange the interspace D to have a uniform width, positioning of the electrostatic chuck 13 and the focus ring 17 needs to be performed. FIG. 9B illustrates one exemplary positioning method that may be used. As illustrated in FIG. 9B, a plurality of recesses 17b (only one of which is illustrated in FIG. 9B) may be arranged on the bottom surface of the focus ring 17, and a positioning pin 90 projecting from the mounting stage 12 may be inserted into the recess 17b to enable positioning of the electrostatic chuck 13 and the focus ring 17. However, in this positioning method, the width of the recess 17b in the radial direction is arranged to be greater than the width of the positioning pin 90 in consideration of thermal expansion. Thus, the positioning pin 90 may move within the recess 17b and the position of the focus ring 17 may deviate to the extent of the movement range of the positioning pin 90.

Figure 9C:
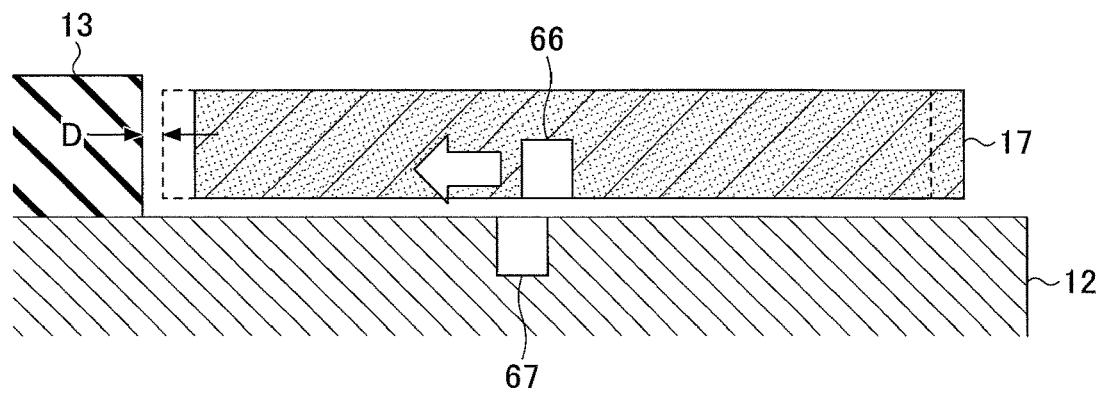

In view of the above, as illustrated in FIG. 9C, in the substrate supporting apparatus 10 according to the present embodiment, magnets 66 and 67 are arranged on the surfaces of the focus ring 17 and the mounting stage 12 facing opposite each other. In this way, even when the focus ring 17 is slightly deviated by stress from heat input during a plasma process, for example, the magnet 66 may be returned to a position above the magnet 67 by magnetic force. As a result, the focus ring 17 may be returned to its proper position with respect to the electrostatic chuck 13. In this way, the interspace D between the electrostatic chuck 13 and the focus ring 17 may be arranged to have a uniform width in the radial direction.

Note that in some embodiments, other magnetic members may be used instead of the magnets 66 and 67. In one preferred embodiment, a plurality of magnetic members such as the magnets 66 and 67 may be disposed at positions of the focus ring 17 and the mounting stage 12 facing opposite each other, the positions being arranged such that the distance from the center of the inner diameter of the focus ring 17 to the position of the focus ring 17 is equal to the distance from the center of the mounting stage 12 to the position of the mounting stage 12. Also, one pair or two or more pairs of ring-shaped magnetic members may be disposed at positions of the focus ring 17 and the mounting stage 12 facing opposite each other, the positions being arranged such that the distance from the center of the inner diameter of the focus ring 17 to the position of the focus ring 17 is equal to the distance from the center of the mounting stage 12 to the position of the mounting stage 12.

In the plasma processing apparatus 1 according to the present embodiment as described above, heat transfer efficiency between the mounting stage 12 and the focus ring 17 of the substrate supporting apparatus 10 may be improved, and temperature adjustment of the focus ring 17 may be effectively performed.

Although illustrative embodiments of a plasma processing apparatus and a substrate supporting apparatus according to the present invention have been described above, the present invention is not limited to these embodiments but includes various variations and modifications that may be made within the spirit and scope of the present invention. Further, the various embodiments and modifications may be combined to the extent practicable.

[Plasma Processing Apparatus]

The substrate supporting apparatus described above may be applied to various plasma processing apparatuses for processing a substrate using plasma. For example, the plasma processing apparatuses may include any apparatus configured to process a substrate by the action of a plasma such as an etching apparatus, an ashing apparatus, and a film deposition apparatus. Also, examples of means used by the plasma processing apparatus to generate a plasma may include a capacitively coupled plasma (CCP) generating unit, an inductively coupled plasma (ICP) generating unit, a helicon wave plasma (HWP) generating unit, a microwave surface wave plasma generating unit for generating a microwave plasma such as a slot plane antenna (SPA) plasma or a microwave plasma generated from a radial line slot antenna, an electron cyclotron resonance plasma (ECR) generating unit, and a remote plasma generating unit using the above plasma generating units, for example.

Also, note that the workpiece subject to processing in the present invention is not limited to a semiconductor wafer, but may be a large-sized substrate for a flat panel display, or a substrate for a solar cell or an EL element, for example.

What is claimed is:

1. A plasma processing apparatus comprising:
   a mounting stage on which a substrate is mounted;
   a focus ring disposed over a peripheral region of the mounting stage;
   a first magnet, magnetic body, or magnetic O-ring member provided at the bottom surface of the focus ring;
   a second magnet, magnetic body, or magnetic O-ring member provided at the upper surface of the mounting stage and arranged at a position opposite the first magnet, magnetic body, or magnetic O-ring member;
   a plurality of members that are made of a material different from the focus ring and are provided in between the focus ring and the mounting stage, whereby the plurality of members seal a heat transfer space defined by a bottom surface of the focus ring, an upper surface of the mounting stage, and the plurality of members, each member of the plurality of members being provided on opposite sides of the space; and
   a temperature adjustment unit configured to adjust a temperature of the focus ring, the temperature adjustment unit including a heat transfer gas supply unit, wherein
   the heat transfer supply unit is configured to supply a heat transfer gas into the heat transfer space,
   the bottom surface of the focus ring, facing opposite the mounting stage, includes a concavo-convex surface,
   the heat transfer space has a height of up to 10 µm,
   each of the plurality of members are provided in a groove formed in at least one of the bottom surface of the focus ring or the upper surface of the mounting stage,
   a first member of the plurality of members being provided along an outer circumference of the focus ring and a second member of the plurality of members being provided along an inner circumference of the focus ring, and
   each of the first member and the second member is an O-ring member.

2. The plasma processing apparatus as claimed in claim 1, wherein the temperature adjustment unit adjusts the temperature of the focus ring by controlling a pressure of the heat transfer gas that is supplied between the bottom surface of the focus ring and the upper surface of the mounting stage.

3. The plasma processing apparatus as claimed in claim 1, wherein at least one of the bottom surface of the focus ring and the upper surface of the mounting stage facing opposite each other includes a groove for diffusing the heat transfer gas.

4. The plasma processing apparatus as claimed in claim 1, wherein the mounting stage includes an electrostatic chuck.

5. The plasma processing apparatus as claimed in claim 1, wherein the temperature adjustment unit adjusts the temperature of the focus ring by supplying the heat transfer gas between the bottom surface of the focus ring and the upper surface of the mounting stage facing opposite each other.

6. The plasma processing apparatus as claimed in claim 1, wherein the heat transfer gas supply unit of the plasma processing apparatus is provided as a single heat transfer gas supply unit.

7. The plasma processing apparatus as claimed in claim 1, wherein
   the first member and the second member of the plurality of members are provided in the upper surface of the mounting stage.

8. The plasma processing apparatus as claimed in claim 1, wherein the first member and the second member are provided in the grooves in the bottom surface of the focus ring; wherein the first member is the first magnetic O-ring member, and the second magnet or magnetic body is located opposite the first member; and the second member is a third magnetic O-ring member, and a fourth magnet or magnetic body is located in the upper surface of the mounting stage opposite the second member.

9. The plasma processing apparatus as claimed in claim 1, wherein the first magnet or magnetic body is provided at a center position of the bottom surface of the focus ring; and the second magnet or magnetic body, is provided at a center position of the upper surface of the mounting stage and arranged at a position opposite the first magnet or magnetic body.

10. The plasma processing apparatus as claimed in claim 1, wherein the first member and the second member are provided in the grooves in the bottom surface of the focus ring; wherein the first member is the first magnetic O-ring member, and the second magnetic O-ring member is located opposite the first member; and the second member is a third magnetic O-ring member, and a fourth magnet or magnetic body is located in the upper surface of the mounting stage opposite the second member.

11. The plasma processing apparatus as claimed in claim 1, wherein the first member is provided in the groove in the bottom surface of the focus ring and the second member is provided in the groove in the upper surface of the mounting stage; wherein the first member is the first magnetic O-ring member, and the second magnet or magnetic body is located opposite the first member; and the second member is a third magnetic O-ring member, and a fourth magnet or magnetic body located in the bottom surface of the focus ring and opposite the second member.

12. A plasma processing apparatus comprising:
a mounting stage on which a substrate is mounted;
a focus ring disposed over a peripheral region of the mounting stage;
a first magnet or magnetic body provided at a center position of the bottom surface of the focus ring;
a second magnet or magnetic body provided at a center position of the upper surface of the mounting stage and arranged at a position opposite the first magnet or magnetic body;
a plurality of members that are made of a material different from the focus ring and are provided in between the focus ring and the mounting stage, whereby the plurality of members seal a heat transfer space defined by a bottom surface of the focus ring, an upper surface of the mounting stage, and the plurality of members, each member of the plurality of members being provided on opposite sides of the space; and
a temperature adjustment unit configured to adjust a temperature of the focus ring, the temperature adjustment unit including a heat transfer sheet, wherein
the heat transfer sheet is provided in the heat transfer space,
the bottom surface of the focus ring, facing opposite the mounting stage, includes a concavo-convex surface,
the heat transfer space has a height of up to 10 μm,
a first member and a second member of the plurality of members are provided between the bottom surface of the focus ring and the upper surface of the mounting stage,
the first member being provided along an outer circumference of the focus ring and the second member being provided along an inner circumference of the focus ring, and
each of the first member and the second member is an O-ring member.

13. The plasma processing apparatus as claimed in claim 12, wherein the temperature adjustment unit uses the heat transfer sheet to adjust the temperature of the focus ring.

\* \* \* \* \*